(12) United States Patent
Fang et al.

(10) Patent No.: US 7,411,436 B2
(45) Date of Patent: Aug. 12, 2008

(54) SELF-TIMED THERMALLY-AWARE CIRCUITS AND METHODS OF USE THEREOF

(75) Inventors: David Fang, Ithaca, NY (US); Filipp Akopyan, Ithaca, NY (US); Rajit Manohar, Ithaca, NY (US)

(73) Assignee: Cornell REsearch Foundation, Inc., Ithaca, NY (US)

( * ) Notice: Subject to any disclaimer, the term of this patent is extended or adjusted under 35 U.S.C. 154(b) by 61 days.

(21) Appl. No.: 11/365,567

(22) Filed: Feb. 28, 2006

(65) Prior Publication Data

US 2007/0200608 A1      Aug. 30, 2007

(51) Int. Cl.
*H03H 11/26* (2006.01)
(52) U.S. Cl. .................................. 327/262; 327/513
(58) Field of Classification Search .................... None
See application file for complete search history.

(56) References Cited

U.S. PATENT DOCUMENTS

| | | | |
|---|---|---|---|
| 4,622,512 A | 11/1986 | Brokaw | |
| 4,843,265 A * | 6/1989 | Jiang | 327/262 |
| 5,130,582 A | 7/1992 | Ishihara et al. | |
| 5,136,182 A | 8/1992 | Fawal | |
| 5,563,760 A | 10/1996 | Lowis et al. | |
| 5,798,667 A | 8/1998 | Herbert | |
| 5,841,312 A | 11/1998 | Mindl et al. | |
| 6,091,286 A * | 7/2000 | Blauschild | 327/543 |
| 6,097,179 A | 8/2000 | Ray et al. | |
| 6,177,788 B1 | 1/2001 | Narendra et al. | |
| 6,445,238 B1 * | 9/2002 | Lesea | 327/262 |
| 6,600,302 B2 | 7/2003 | Ghozeil et al. | |
| 6,646,488 B2 | 11/2003 | Ajit | |
| 6,671,152 B1 | 12/2003 | Hersel et al. | |
| 6,727,744 B2 | 4/2004 | Nagaya | |
| 6,756,826 B1 | 6/2004 | Klein et al. | |
| 6,765,836 B2 | 7/2004 | Menczigar | |
| 6,799,889 B2 | 10/2004 | Pennock | |
| 6,803,803 B1 | 10/2004 | Starr et al. | |
| 6,819,157 B2 | 11/2004 | Cao et al. | |
| 6,822,504 B2 | 11/2004 | Morikawa | |
| 7,088,172 B1 * | 8/2006 | Lesea et al. | 327/543 |
| 7,250,796 B2 * | 7/2007 | Hidaka et al. | 327/112 |
| 2003/0193360 A1 | 10/2003 | Lee et al. | |
| 2004/0196090 A1 | 10/2004 | Sutherland | |

* cited by examiner

*Primary Examiner*—Cassandra Cox
(74) *Attorney, Agent, or Firm*—Burns & Levinson LLP; Jacob N. Erlich; Orlando Lopez

(57) ABSTRACT

Apparatus and methods for regulating gate delays of synchronous and asynchronous digital circuits. Thermally-sensitive circuits include, generally, temperature sensitive voltage sources outputting a voltage signal indicative of the temperature of the digital circuit, where the voltage signal reflects non-linear temperature sensitivity above a predetermined threshold temperature, and delay mechanisms receiving said temperature sensitive voltage signal(s) as input and being configured to automatically continuously modulate the speed of signal propagation through the circuit in response to said voltage signal, thereby causing circuit elements within the circuits to switch less frequently and consequently causing the circuit elements to generate less heat with increasing circuit temperature.

25 Claims, 7 Drawing Sheets

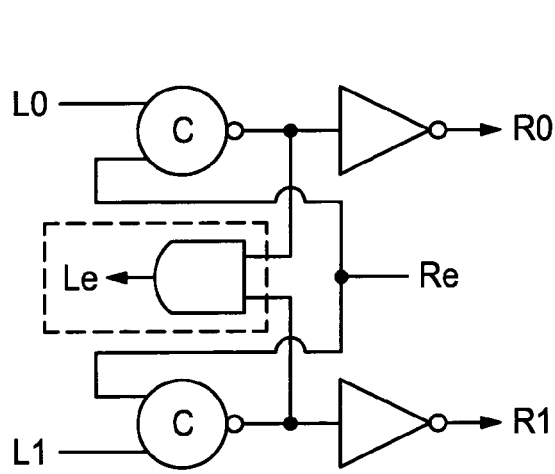
FIG. 12A
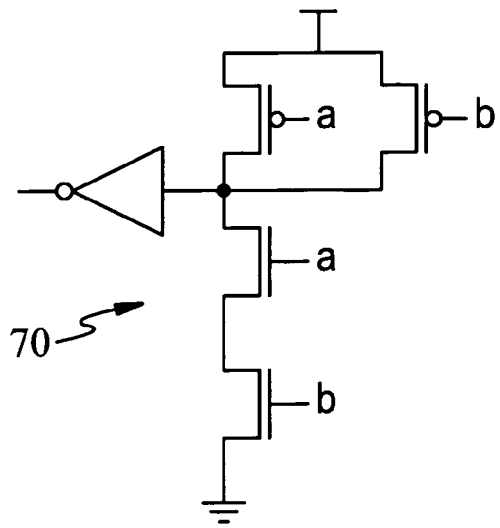
FIG. 12B
(PRIOR ART)
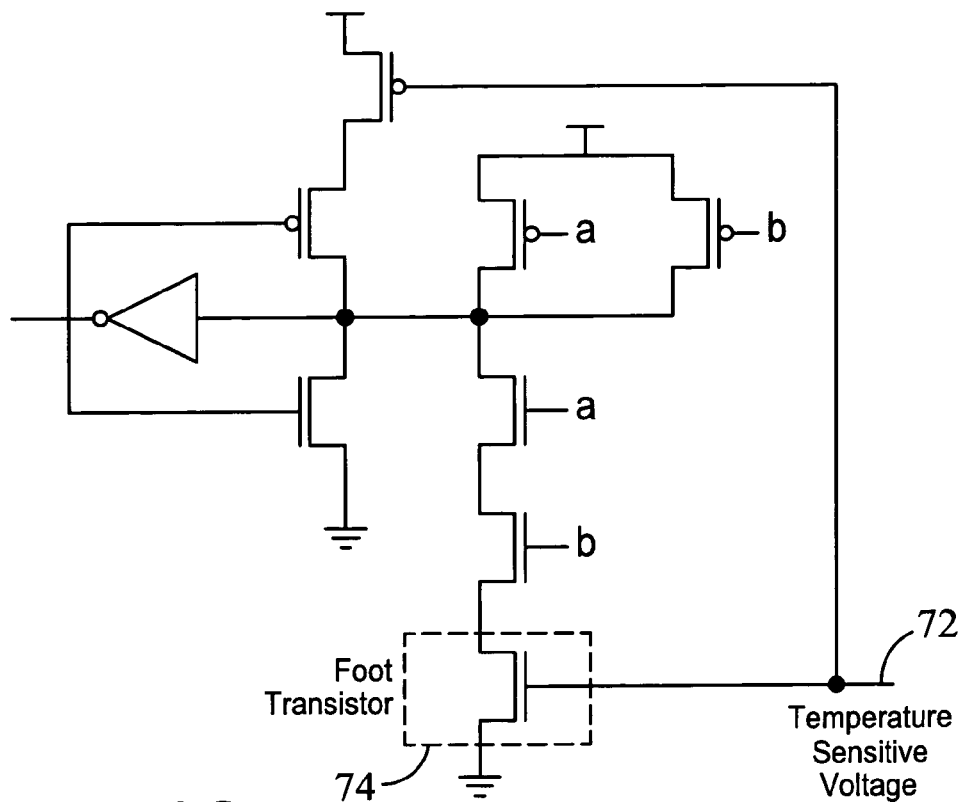
FIG. 12C  AND augmented with foot transistor to be temperature sensitive

SELF-TIMED THERMALLY-AWARE CIRCUITS AND METHODS OF USE THEREOF

STATEMENT REGUARDING FEDERALLY SPONSORED REASEARCH OR DEVELOPMENT

This invention was made with Government support from the Advanced Research Projects Agency (ARPA) under Contract No. N66001-04-C-8032. The Government has certain rights in the invention.

FIELD OF THE INVENTION

The present invention is directed to delay circuits and, more particularly, to thermally-sensitive circuits that can be used to regulate gate delays.

BACKGROUND OF THE INVENTION

As the power density of modern integrated circuits continues to increase with shrinking feature size, power and temperature management become increasingly important. Thermal profiling, along side analog simulation, is crucial to designing large and power-hungry circuits (see *IEEE Transactions on Computer-Aided Design of Integrated Circuits and Systems*, 19(8):1211-1220, October 2000, "A temperature aware simulation environment for reliable ULSI chip design", Y. K. Cheng and S. M. Kang; and *IEEE Transactions on Computer-Aided Design of Integrated Circuits and Systems*, 17(8):668-681, August 1998, "ILLIADS-T: An electrothermal timing simulator for temperature-sensitive reliability diagnosis of CMOS VLSI chips", Y. K. Cheng, et al.) Static thermal profile information can be used to place circuits on a die to maximize temperature uniformity, thereby reducing the peak temperature (see *IEEE Transactions on Computer-Aided Design of Integrated Circuits and Systems*, 19(2):253-266, February 2000, "Cell-level placement for improving substrate thermal distribution" C. H. Tsai and S. M. Kang.) Likewise, dynamic temperature profiling can be used to direct operation, e.g. halting the system when the circuit is too hot, or switching to a lower power mode.

Circuits that overheat beyond specified operating conditions may suffer timing failures, or become damaged for various reasons, including thermal runaway. Traditional power management in synchronous systems often involves transitions to different system states or modes, typically involving changes in clock frequencies or voltage levels. However, as computational operations are performed more rapidly and involve increasingly larger amounts of computational circuitry, it is becoming progressively harder to synchronize computational operations with reference to a single global clock signal. In many cases, enforcing such synchronization greatly constrains the performance of the computational circuitry. To remedy this problem, some designers have begun to investigate the possibility of using "asynchronous" circuits that do not operate with reference to a global clock signal, and are hence not constrained by the need to continually synchronize computational operations with the global clock signal. In many cases, such asynchronous circuits can increase computational speed by an order of magnitude or more.

Asynchronous circuits operate without any global clock, and use handshakes to move and communicate data. The data-driven nature of asynchronous circuits allows a circuit to idle with no switching activity when there is no work to be done. Increasing the computational speed of an asynchronous circuit causes the circuit to switch more frequently, resulting in increased power consumption and consequently a significant amount of heat. Computing systems typically employ various components to dissipate this heat, such as heat sinks and cooling fans. However, as the computational speed of semiconductor chips continues to increase, and as these chips are packed more closely together to minimize propagation delay between the chips, it is becoming progressively harder to effectively dissipate this heat. This leads to excessive heat buildup, which can cause a computer system to fail, and in some cases can permanently damage circuitry within the computer system.

Asynchronous circuits are capable of operating correctly in the presence of continuous and dynamic changes in delays. Sources of delay variation may include temperature, supply voltage, manufacturing, noise, radiation and other transient phenomena. The frequency of an asynchronous pipeline is determined by the gate delays on the critical path rather than an external frequency source. As the circuit heats up, the gate delays increase and the frequency naturally drops, thereby reducing the circuit's dynamic power consumption and self-heat generation. However, the natural negative feedback retardation of this self-heating rate is too weak to halt the increase in temperature (see "An Energy-Complexity model for VLSI computations", J. A. Tierno. PhD thesis, California Institute of Technology, 1995.)

It would, thus, be useful to provide a method and apparatus that automatically regulates the performance, power consumption and resultant generated heat of asynchronous circuits.

Some conventional voltage reference circuits requiring PVT (process, supply voltage, temperature) independence have used diode or bipolar junction transistor (BJT) bandgap reference circuits to generate temperature dependent signals used in voltage and/or current compensation. Circuits such as these typically require a supply voltage of at least 1.3 volts. As technology improves, and components become smaller, the supply voltages continues to drop. Some current processors operate with supply voltages of 1.4 volts, close to the limit at which diode or BJT bandgap circuits will become ineffective for use as supply voltages due to the silicon bandgap of 1.23 volts.

In light of the increasing use of non-power supply voltages in integrated circuit devices, there is an additional need for thermal management circuits and methods to impose negligible implementation overhead.

SUMMARY OF THE INVENTION

The present invention provides a mechanism and a method for automatically regulating the performance and power consumption of integrated circuits. The self-timed nature of asynchronous circuits is leveraged to allow delays to vary continuously during operation, enabling stall-free performance-throttling and the limiting of heat build up. The timing-robustness of asynchronous circuits also facilitates use of a thermally-sensitive delay elements to automatically, continuously modulate the speed of selected circuits without interrupting operation, and without imposing significant implementation overhead.

In one aspect, the present invention provides easily-implemented, thermally-sensitive circuits and methods for regulating the performance of asynchronous (or self-timed) circuits. The approach does not require complex temperature measurement circuitry, rather, the respective temperature response of sub-threshold devices is used to construct a signal for controlling the speed of other circuits. An explicit temperature sensitivity is introduced to amplify the dynamic range of a temperature controlled delay element. A properly designed delay element can then be used to adjust the frequency of a local circuit, wherein, for example, an increase in circuit temperature increases the delay of the digital circuits.

In another aspect, the present invention provides apparatus and methods for regulating heat within an asynchronous circuit. During operation, a temperature sensitive voltage source generates a voltage signal indicative of the temperature within the asynchronous circuit. The voltage signal reflects non-linear temperature sensitivity above a predetermined threshold temperature, such that the delay introduced into the asynchronous circuit grows non-linearly above said threshold temperature. The temperature sensitive voltage signal is received as an input by a voltage-controlled delay mechanism that is configured to automatically continuously modulate the speed of signal propagation through the circuit in response to said voltage signal, causing circuit elements within the asynchronous circuit to switch less frequently and consequently causing the circuit elements to generate less heat with increasing circuit temperature.

In one embodiment, the temperature sensitive voltage source comprises a pair of transistors forming a resistive voltage divider, each judiciously sized and sub-threshold biased to have explicit temperature sensitivity characteristics. A first of the transistors is preferably biased for near-threshold operation, while the second transistor is biased for deep sub-threshold operational region. The voltage signal indicative of the circuit temperature is output at a node coupling the source electrode of the first electrode to the drain of the second transistor. Voltage sources biasing the transistors may be disposed off-chip remote from any local heating effects. An advantage of an apparatus in accordance with the present invention is that temperature sensing is performed indirectly by the transistors, without additional, direct temperature sensors. Additionally, the transistors do not require significant power to operate. For example, during operation peak current flowing through the transistors is on the order of picoamperes to tens of nanoamperes. All the voltages used for biasing to set the delay characteristics can be designed in a way to allow calibration following production, as known in the art.

In another embodiment, the voltage sensitive delay mechanism comprises a foot transistor of a pull-down circuit, wherein the output node of the temperature sensitive voltage source biases the gate electrode of the foot transistor. The drain electrode of the foot transistor is connected to a logic gate such as, for example, a logic circuit inverter, and the source electrode of the foot transistor is shunted to ground, such that changes in the temperature sensitive voltage source voltage modulates source-drain current of the foot transistor and thereby the speed of a pull-down transition, i.e., an increase in circuit temperature is translated into a lower output voltage signal and corresponding lower foot transistor current and increased delay in the pull-down transition. The apparatus operates automatically and continuously, such that changes in the circuit temperature will result in an almost immediate corresponding change in the introduced delay.

In yet another embodiment, an apparatus in accordance with the present invention also includes a state-holding component such as, for example, a conditional staticizer, coupled to the output node of said temperature sensitive voltage source. The conditional staticizer is configured with the logic gate of the asynchronous circuit to maintain the logic gate voltage level existing when the temperature of the asynchronous circuit exceeds a predetermined threshold temperature until the circuit temperature falls below the predetermined threshold temperature.

In another aspect, and as described below, the present invention provides integrated circuit devices incorporating thermally-sensitive circuits, such as, for example, delay circuits, ring oscillators, and/or any asynchronous logic family that uses handshaking, such as field programmable gated arrays (FPGAs).

In yet another aspect, the present invention provides integrated circuit devices and methods for thermally-aware dynamic resource scheduling. Such devices typically include an asynchronous dispatcher adapted to forward data among multiple similar function units and, preferably, an arbiter adapted to select the multiple similar function units to which data should be sent. A modified logic gate as described above is integrated within each logic block buffer of each function responsible for generating acknowledges for the arbiter indicating the readiness of the associated function unit to receive and process data. The speed of signal propagation through the at least one logic gate in each function block is automatically continuously modulated in response to the indirectly sensed temperature of the particular function block, and adjustments to the switching frequency of the logic gate are made, consequently causing the frequency of readiness acknowledges transmitted from each particular function unit to the arbiter to vary with temperature of that unit. The arbiter receives and selects from among the readiness acknowledges, and sends data to the function unit associated with the selected acknowledge.

An advantage of the present invention is that the circuits and methods providing thermal regulation may be selectively, rather than globally, utilized. That is, thermally-aware modified logic gates may be incorporated into certain logic pathways of a circuit but not other logic pathways in the same circuit. Thus, if it has been determined that it is acceptable for particular logic pathways to operate faster than others, there is no need to slow the entire circuit down with a global delay. Also, the present invention is not limited to asynchronous circuits. For example, the mechanisms and methods described herein may also be applicable in Globally-Asynchronous, Locally Synchronous circuit designs, by local frequency scaling in a clock domain using a temperature-sensitive frequency synthesizer.

BRIEF DESCRIPTION OF THE FIGURES

For a better understanding of the present invention, together with other and further objects thereof, reference is made to the accompanying drawings and detailed description, wherein:

FIGS. 12A-12C are circuit diagrams of logical AND gates existing in the prior art and as modified consistent with principles of an embodiment of the present invention.

DETAILED DESCRIPTION OF PREFERRED EMBODIMENTS OF THE INVENTION

The following description is presented to enable any person skilled in the art to make and use the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

A. Performance and Temperature Regulating System

Figure 1:
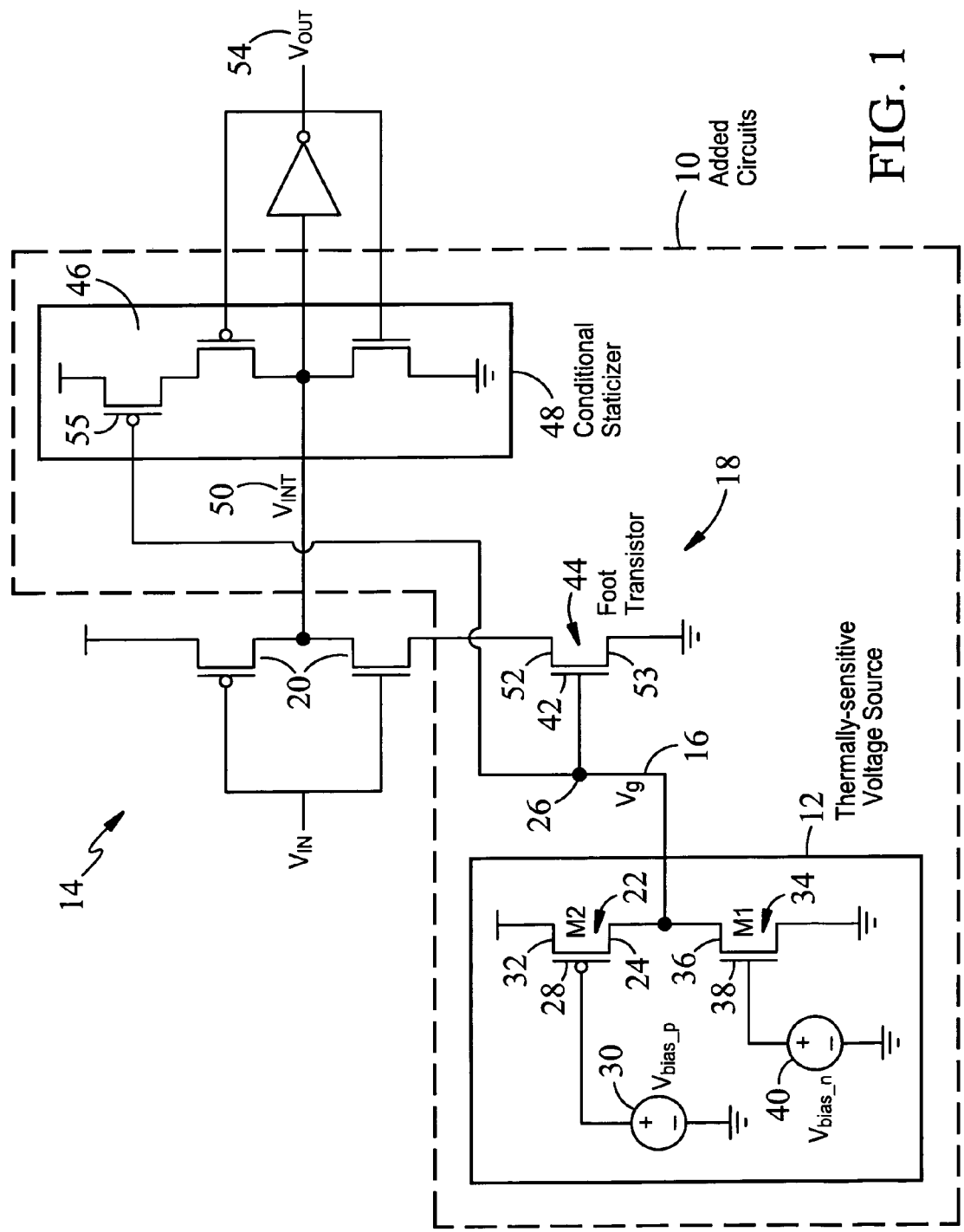
FIG. 1 is a circuit diagram of an inverter-pair modified with additional foot transistor controlled by a thermally-sensitive voltage source in accordance with an embodiment of the present invention.

FIG. 1 illustrates a system 10 that regulates gate delays, and thereby the performance, power consumption and temperature of an asynchronous digital circuit 14 in accordance with an embodiment of the present invention. System 10 includes an easily implemented thermally-sensitive voltage source 12 outputting a voltage signal $V_g$ 16 indicative of the temperature of the asynchronous circuit 14, which in most embodiments can include any type of circuit that does not synchronize computational operations and data movement operations with reference to a system clock. In certain embodiments, however, the thermally regulated circuit is a globally asynchronous, locally synchronous (GALS) circuit including local frequency scaling in a clock domain using a temperature-sensitive frequency synthesizer. Voltage signal $V_g$ 16, as will be described below, reflects non-linear temperature sensitivity above a predetermined threshold temperature. System 10 also includes a delay mechanism 18 receiving voltage signal $V_g$ 16 as an input. The delay mechanism 18 automatically and continuously modulate the speed of signal propagation through circuit 14 in response to the temperature dependent voltage signal $V_g$ 16, thereby causing circuit elements, such as logic gate 20 within the asynchronous circuit 14 to switch less frequently and consequently causing the circuit elements to generate less heat with increasing circuit temperature.

It is the self-timed nature of asynchronous circuits that allows delays to vary continuously during operation, enabling stall-free performance-throttling. The present invention leverages the temperature response of subthreshold devices 22,34 to construct voltage signal $V_g$ 16, which is utilized to control the speed of other circuits. Increases in the temperature of circuits, generally, increases the delay of digital circuits. The present invention introduces explicit temperature sensitivity to amplify the dynamic range of a temperature controlled delay element, delay mechanism 18. A properly designed delay element can then be used to adjust the frequency of a local circuit such as, for example, asynchronous circuit 14.

Asynchronous circuits operate without any global clock, and use handshakes to move and communicate data. The data-driven nature of asynchronous circuits allows a circuit to idle with no switching activity when there is no work to be done. Asynchronous circuits are capable of operating correctly in the presence of continuous and dynamic changes in delays. Sources of delay variation may include temperature, supply voltage, manufacturing, noise, radiation and other transient phenomena. The timing-robustness of asynchronous circuits facilitates the use of the thermally-sensitive delay element 18 to automatically continuously modulate the speed of selected circuits of circuit 14 without interrupting operation.

B. Thermal Dependence

In certain embodiments, the thermally-sensitive voltage source 12 includes a first transistor M2 22 having a source electrode 24 coupled to an output node 26, a gate electrode 28 coupled to a first bias voltage 30 biasing transistor M2 22 in a sub-threshold region so as to have a first thermal sensitivity, and a drain electrode 32. A second transistor M1 34 having a drain electrode 36 is coupled to the output node 26 and the source electrode 24 of transistor M2 22. Gate electrode 38 of transistor M1 34 is coupled to a second bias voltage 40 biasing transistor M1 34 in a sub-threshold region so as to have a second thermal sensitivity distinct from the thermal sensitivity of M2 22. Transistors M1 34 and M2 22 form a resistive voltage divider, such that the temperature sensitive voltage signal $V_g$ 16 is produced at the output node 26.

The operation of transistors, generally, in the sub-threshold region is more sensitive to temperature than the above-threshold region. In the sub-threshold region, the source-drain current is exponentially dependent on temperature (see Behzad Razavi. *Design of Analog CMOS Integrated Circuits*. Tata McGraw-Hill, 2004, incorporated herein by reference):

$$I_D = I_0 \cdot \exp\left(\frac{V_{gs} \cdot q}{S \cdot k \cdot T}\right) \quad \text{Eqn. 1}$$

where $I_D$ is the drain-source current, $I_0$ depends on channel width, channel length, diffusion constant of carriers, carrier density and electron charge (see Neil Weste and David Harris. *CMOS VLSI Design: A Circuits and Systems Perspective*. Addison-Wesley, 2005, incorporate herein by reference), $\zeta$ is a nonideality factor (greater than 1), and T is temperature in Kelvin.

In thermally-sensitive voltage source 12, transistors M1 34 and M2 22 are biased differently to have contrasting thermal sensitivities. In one embodiment, transistor M1 34 is designed and biased to operate in deep subthreshold (more temperature-sensitive), while transistor M2 22 operates near-threshold. The bias voltages 30,40 and the respective sizes of transistors M1 and M2 are chosen to achieve the desired temperature response for a given technology. The bias voltages 30,40 can be generated off-chip relative to transistors M1, M2 for post-fabrication tuning and runtime controlling. This circuit was sufficient to meet the intended design goals, however the circuit can be more generally characterized as using different temperature-sensitive structures to produce arbitrary temperature-delay characteristics.

FIG. 1 shows how the thermally-sensitive voltage source 12 is connected to, and can be used to control the gate 42 of a foot transistor 44 in logic circuitry 20. A drain electrode 52 of the foot transistor is connected to logic gate 20, and a source electrode 53 of foot transistor 44 is coupled to ground. The foot transistor 44 will operate anywhere between fully-on and mostly-off to modulate the speed of a pull-down transition of logic circuitry 20 (e.g., a logic gate.) As temperature increases, foot transistor 44 will conduct less source-drain current, until the point where foot transistor 44 will just be off, halting the circuit 14. When foot transistor 44 is off, a pull-up half 46 of a conditional staticizer 48, such as known in the art, will weakly retain the value of $V_{int}$ 50. Conditional staticizer 48 is connected at input electrode 55 to output node 26 of temperature sensitive voltage source 12, and is adapted to maintain $V_{OUT}$ 54 at the voltage level $V_{int}$ 50 of logic gate 20 existing when the temperature of circuit 14 exceeds a predetermined threshold temperature and until the circuit temperature falls below said threshold temperature. The effective delay of circuit 14, including the described modifications, is modeled as a function of temperature below, for the digital-thermal simulation described in the "Evaluation" section.

What follows is an example of the circuit with parameters tuned for a particular temperature response.

C. Design Example

Figure 2:
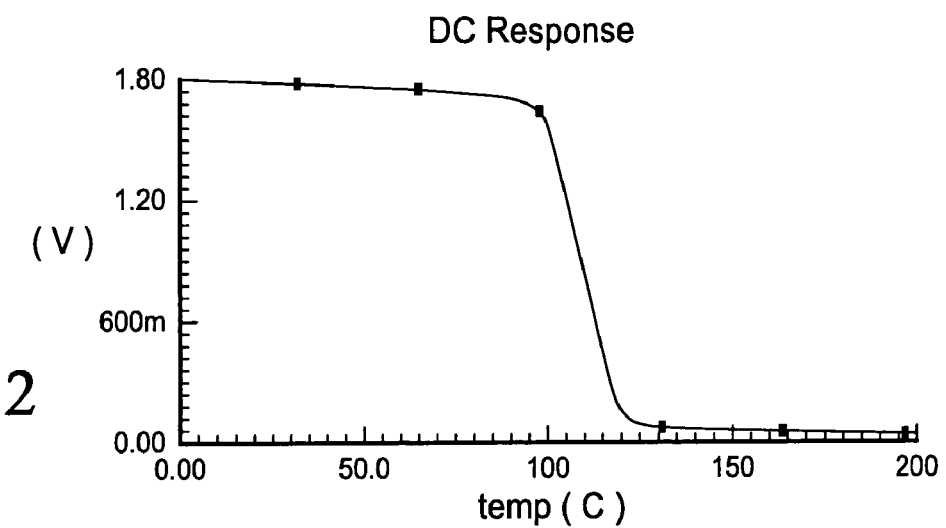
FIG. 2 is a graph illustrating a foot transistor Vg-T dependence.

The inventors simulated the temperature-dependent circuit 14 shown in FIG. 1 using TSMC (Taiwan Semiconductor Manufacturing Company) 0.18 micron technology parameters, with a 1.8 V nominal supply $V_{dd}$. In the example, a temperature-performance response was targeted that drops sharply above 100° C., boiling point. The following design parameters yielded the Vg-T response shown in FIG. 2: for sub-threshold transistor M1 34, Width=5 pm, Length=400 nm; for the weak current source M2 22, W=600 nm, L=5 pm; the size of the foot transistor 44 in the simulation was W=720 nm, L=360 nm. Vbias_n on M1 was 200 mV, and Vbias_p on M2 was 1.3 V. FIG. 2 shows the Vg switching sharply near 100° C., and practically turning off the foot transistor 44 by 120° C.

Figure 3:
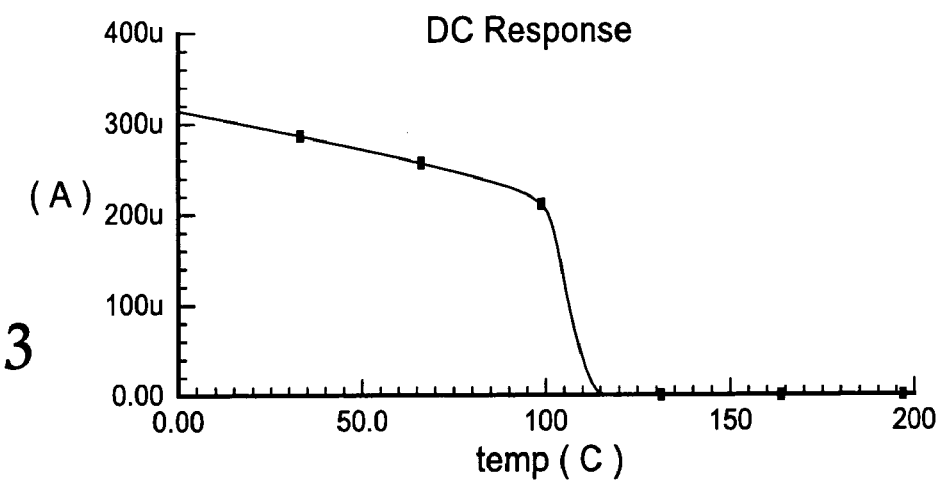
FIG. 3 is a graph illustrating a foot transistor I-T dependence.
Figure 4:
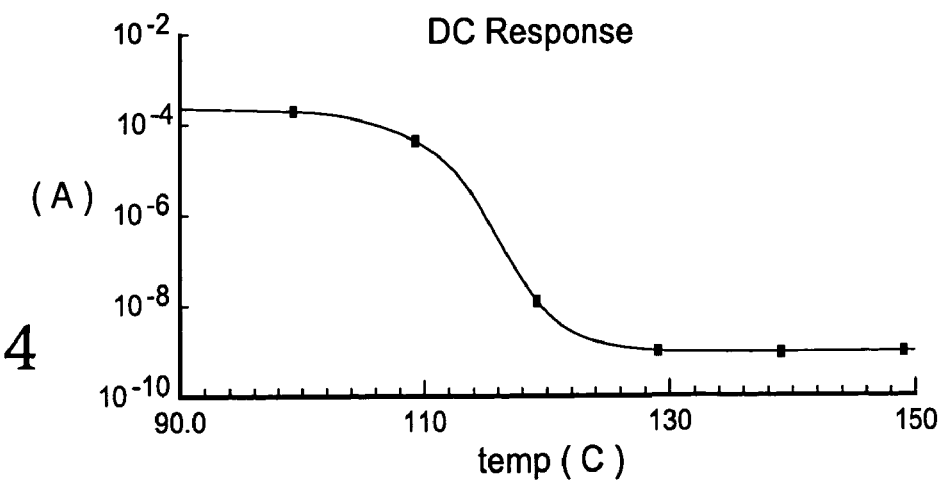
FIG. 4 is a graph illustrating a foot transistor I-T dependence in a zoomed in region.

In a simplified setup, where the drain electrode 52 of the foot transistor 44 is connected directly to a $V_{dd}$ voltage source, the drain-source current through foot transistor 44 was also measured. The results of the current measurement are shown FIG. 3. In the domain where the foot transistor 44 is on, the initial slope (up to 90° C.) is due to temperature-dependent properties in the above-threshold saturated region: the mobility of electrons/holes and threshold voltage $V_{th}$ shifts (see J. M. Daga, E. Ottaviano, and D. Auvergne. Temperature effect on delay for low voltage applications. In *Proceedings of the Conference on Design, Automation and Testing in Europe*, pages 680-685, 1998, incorporated herein by reference). Beyond 95° C., the conductivity drops sharply due to the transition in Vg 16. FIG. 4 shows a close-up of the foot transistor current response above 90° C. on a log-scale. Between 110 and 120° C., the current decays exponentially until a floor current is reached.

Figure 5:
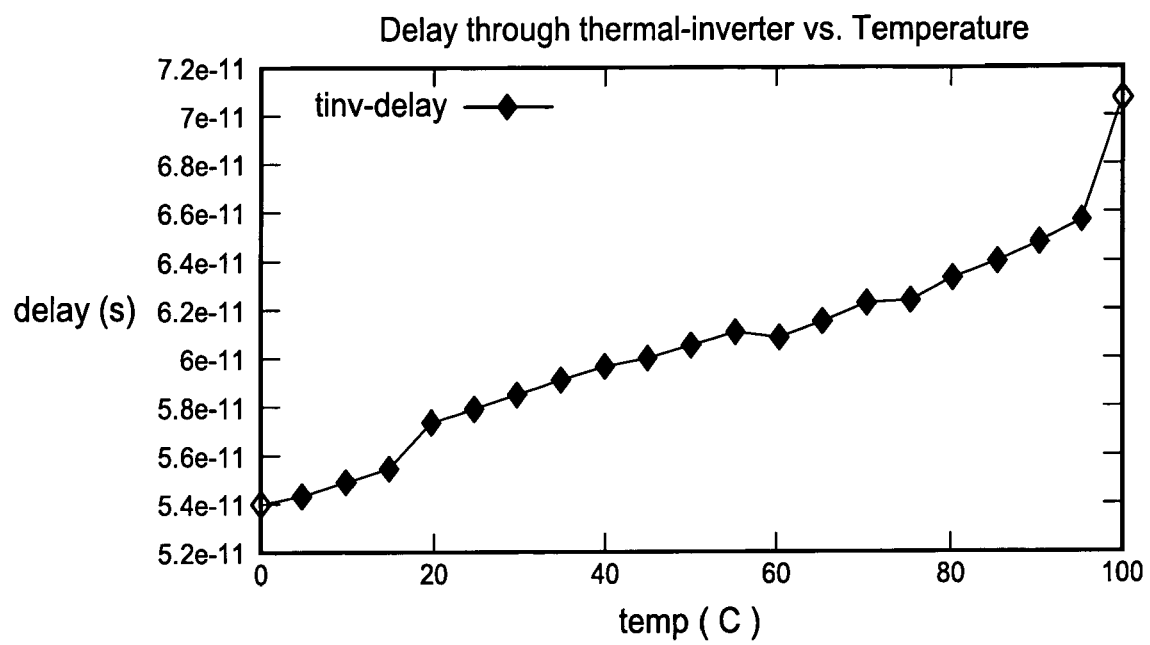
FIG. 5 is a graph illustrating an exemplary delay through a modified inverter.
Figure 6:
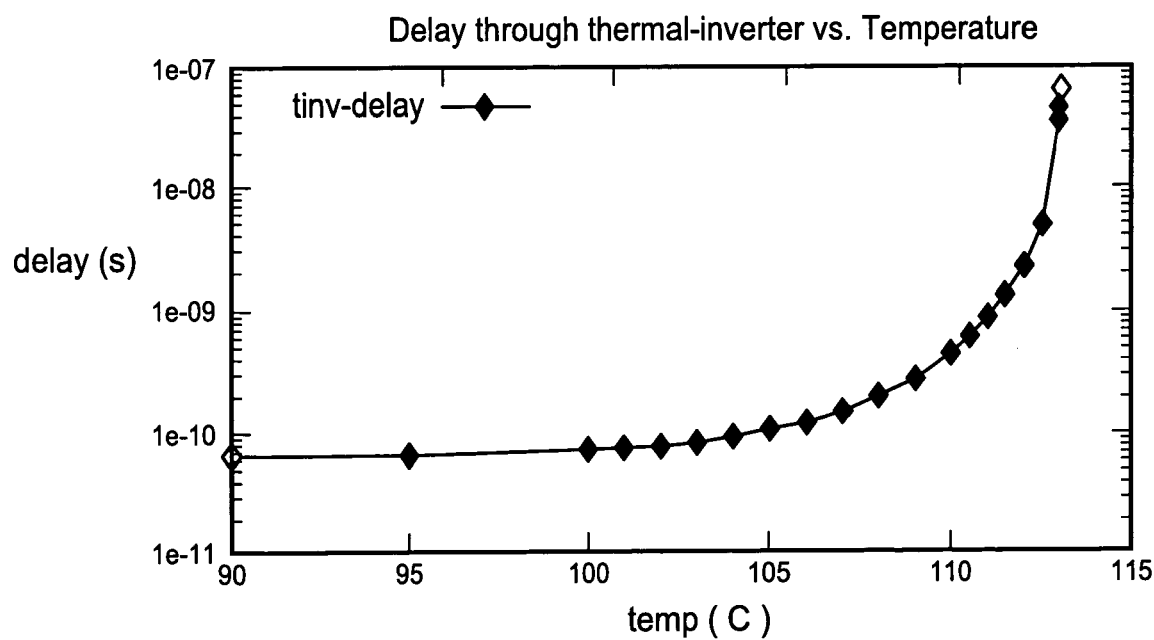
FIG. 6 is a graph illustrating an exemplary delay through a modified inverter in log scale.
Figure 7:
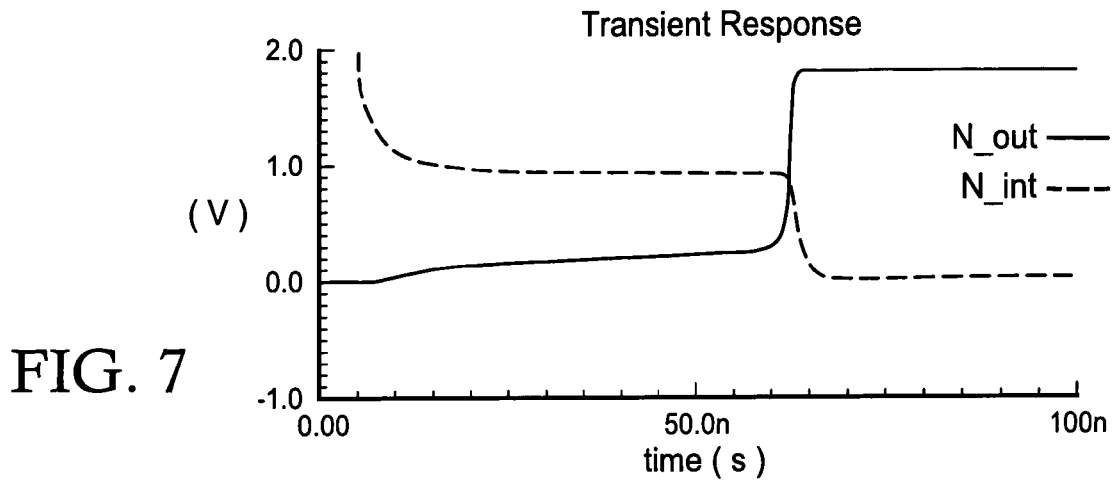
FIG. 7 is a graph illustrating exemplary waveforms of thermally-sensitive inverter signals at 113° C.

The delay through the modified circuit 14 was measured and is plotted as a function of temperature in FIG. 5, on a linear scale, and in FIG. 6, zoomed in on log-scale. The delay is approximately linear up to around 95° C. FIG. 7 shows the waveform of cross-coupled nodes $V_{int}$ and $V_{out}$ from FIG. 1 switching at 113° C. The internal $V_{int}$ is slowly pulled to the switching threshold while being opposed by the staticizer. After 60 ns, a long delay, $V_{out}$ finally switches cleanly, and stabilizes $V_{int}$ through weak positive feedback. The intermediate logic level of $V_{int}$ is internal to this sub-circuit and never used elsewhere. The output if $V_{out}$ is cleanly digital in all situations, only ever delayed arbitrarily, which is acceptable to asynchronous circuits.

Above 113° C., $V_{out}$ never switches because the current through the pull-down logic is insufficient to overpower the pull-up staticizer, so the delay is infinite. This means the circuit will naturally halt above a critical temperature, and resume once the temperature drops sufficiently. The delay-derating factor was approximated with a piecewise-continuous function of temperature in the digital-thermal simulator.

Figure 8:
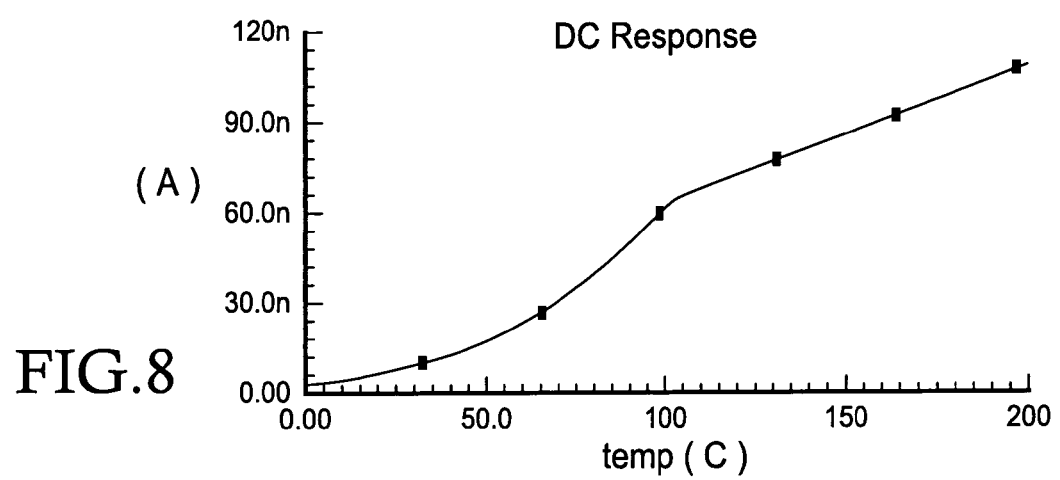
FIG. 8 is a graph illustrating an exemplary sub-threshold transistor I-T relationship.

The static power consumption of the temperature dependent voltage source 12 is due to the current through the sub-threshold, weakly-sized transistors M1 34 and M2 22. FIG. 8 plots the current through transistors M1 and M2 as a function of temperature; using the sizes and parameters we have chose in our example, the peak current is on the order of tens of nA, comparable to leakage current for this technology. Thus, the power consumption of the thermally sensitive voltage source 12 is negligible compared to the power in rest of the system.

D. Delay Model

For normal (not thermally-sensitive) transistors, the following model can be used for delay-derating as a function of voltage and temperature (here denoted as θ). The derating function can be factored into three components: a voltage dependent factor f, a temperature-dependent factor g, and a mixed threshold voltage term h.

$$\frac{d(V_{dd}, \theta)}{d_{nom}} = f(V_{dd}) \cdot g(\theta) \cdot h(V_{dd}, \theta) \quad \text{Eqn. 2}$$

$$f(V_{dd}) = \left(\frac{V_{dd}}{V_{dd,0}}\right)^{1-\alpha} \quad \text{Eqn. 3}$$

$$g(\theta) = \left(\frac{\theta}{\theta_0}\right)^{\theta_k} \quad \text{Eqn. 4}$$

$$h(V_{dd}, \theta) = \left[\left(1 - \frac{V_{T_0}(\theta_0)}{V_{dd,0}}\right) \Big/ \left(1 - \frac{V_{T_0}(\theta_0)}{V_{dd}} + \frac{\sigma \Delta \theta}{V_{dd}}\right)\right]^{\alpha} \quad \text{Eqn. 5}$$

Table 1 lists the parameters used for the simulations, using a TSMC 0.18 micron technology. Some parameters have separate values for NFETs and PFETs, denoted by additional subscripts N and P. The coefficients were determined through empirically fitting to hspice data.

TABLE 1

| Simulation parameters | |
|---|---|
| Parameter, symbol | value |
| Nom. Supply voltage $V_{dd,\,0}$ | 1.8 V |
| Nom. Threshold voltage $V_{T0}$ | 0.4 V |
| Nom. Temperature, $\theta_0$ | 300 K |
| Velocity saturation index, $\alpha_N, \alpha_P$ | 1.5, 1.7 |
| Threshold coefficient, $\sigma_N, \sigma_P$ | 2e-3, 1.5e-3 V/K |
| Temp. mobility index $\theta_{k,\,N}, \theta_{k,\,P}$ | 1.65, 1.65 |

E. Evaluation

This section presents the results of exemplary simulations or circuits that use proposed thermally-sensitive transistors. As shown below, in each non-limiting example, one or more logic gates modified with temperature-sensitive voltage sources and delay mechanisms in accordance with the present invention are substituted for one or more selected logic gates (inverters) in example digital circuits. The result is are circuits that regulates their speed based on the local circuit temperature with minimal hardware overhead. Several examples of varying complexity are now described to demonstrate the effectiveness of the thermally-sensitive modified circuits.

The simulator employed was an event-driven digital simulator, extended to capture the transient effects of temperature and supply voltage on delay. The input to the simulator comprised a sized netlist including event rules describing the logic. Event rules were tagged with a voltage domain (all the same in these cases), a thermal region corresponding to physical placement, and a flag for thermal-sensitive performance response. Delays and capacitances are based on the logical effort model and calibrated against a TSMC 0.18 micron technology. The simulator accounts for gate and parasitic output capacitances in computing switching energy and delay, but does not account for internal capacitances in transistor stacks. Digital simulation is coupled with a finite-element thermal simulator, where switching circuits inject heat into their respectively mapped thermal regions. For the present purposes, the systems were modeled as a silicon die mounted on an aluminum heat sink in contact with constant temperature air. This simple simulator has the advantage of the fast digital simulation with the added realism of transient thermal effects.

Ring Oscillator

Figure 9:
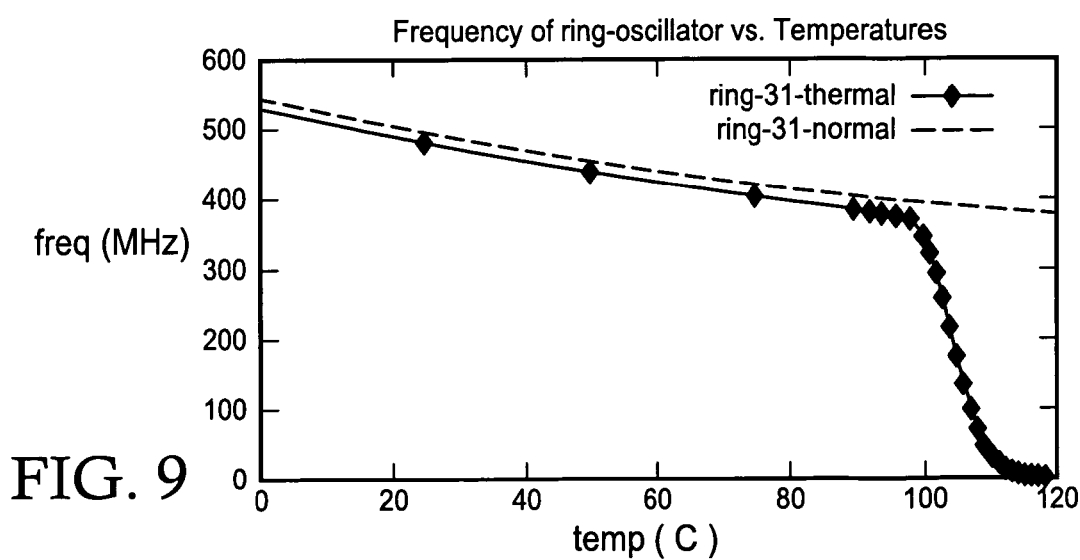
FIG. 9 is a graph illustrating an exemplary frequency of a normal (dashed) and thermally-sensitive (solid) ring oscillator vs. circuit temperature.
Figure 11:
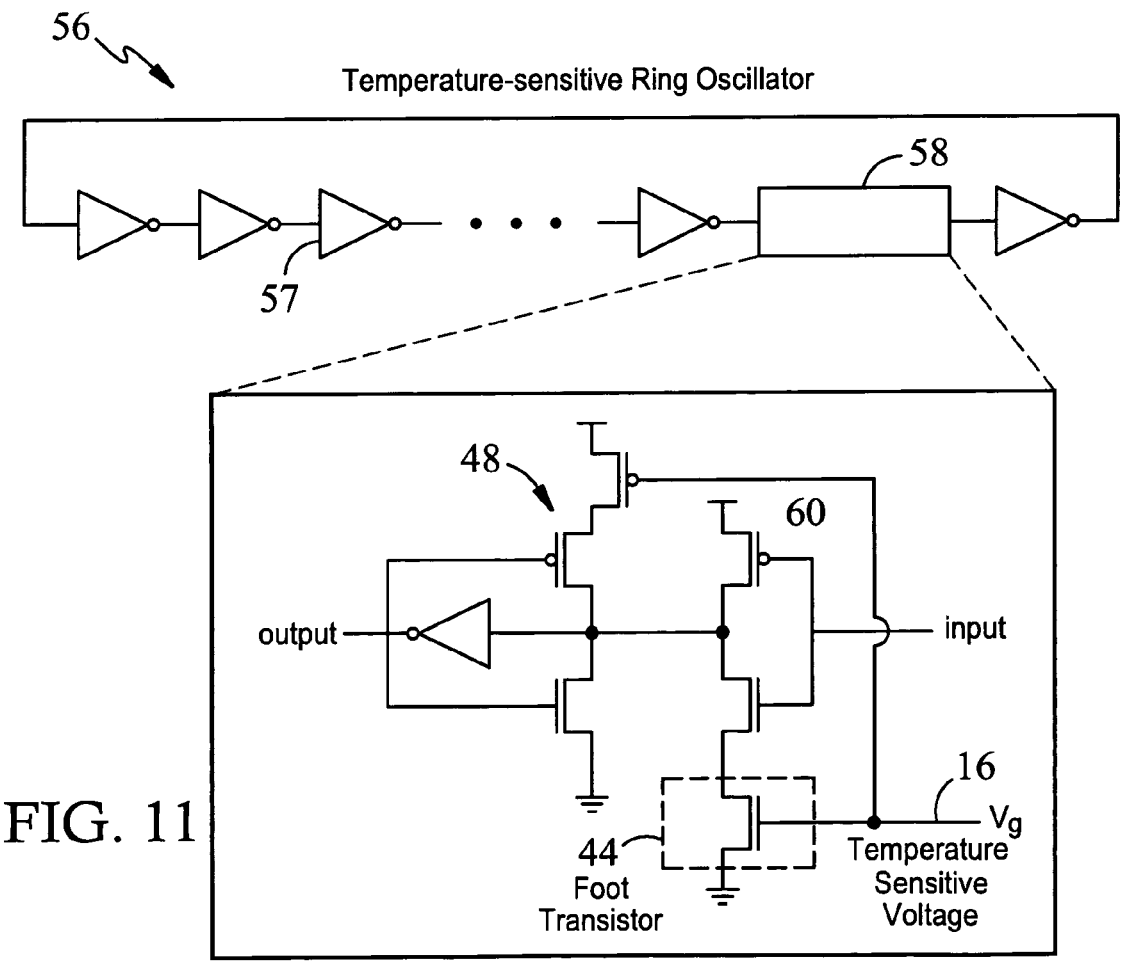
FIG. 11 is a circuit diagram of an exemplary temperature-sensitive ring oscillator in accordance with an embodiment of the present invention.

FIG. 11 illustrates a portion of a multi-stage ring oscillator 56 comprised of an odd number of inverter stages 57, 58 with one stage 58 modified to a thermally-sensitive transistor inverter 60. The oscillator frequencies are plotted against temperature in FIG. 9. As expected, the frequency quickly degrades past around 100° C., beyond which the delay grows exponentially. Before 95° C., the difference between the curves shows what performance overhead one might expect from adding a thermally-sensitive inverter to a critical path.

Figure 13:
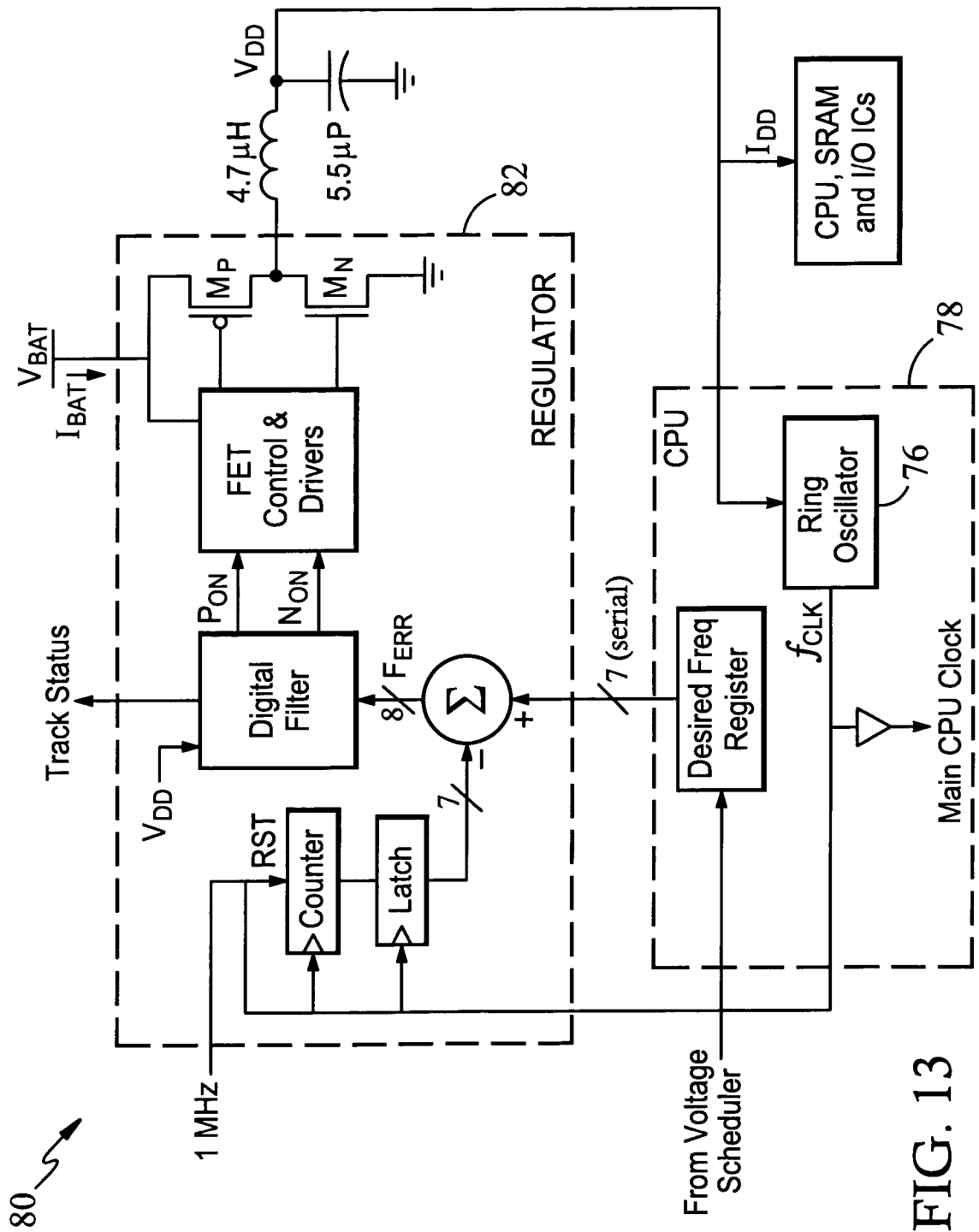
FIG. 13 is a circuit diagram of a thermally-regulated frequency synthesizer in a synchronous circuit in accordance with an embodiment of the present invention.

With reference to FIG. 13, a temperature-sensitive ring oscillator 76 in accordance with the principles of the present invention may be beneficially utilized in a traditional clock generator 78 in a synchronous system 80 that supports dynamic voltage and/or frequency scaling. System 80 contains a control loop that has a current reference frequency used by system 80. Operational details of system 80 not essential to the present invention can be found in Thomas D. Burd, et al., "A Dynamic Voltage Scaled Microprocessor System", *IEEE Journal of Solid-State Circuits*, Vol. 35, No. 11, November 2000, which is incorporated herein by reference. Ring oscillator 76 on the CPU chip outputs a clock signal whose frequency is a function of the supply voltage $V_{DD}$, and is designed to track the critical paths of a microprocessor over voltage. Ring oscillator 76 could be replaced with a more sophisticated circuit such as, for example, a replica path form the critical path of the block whose frequency is being generated, such as is known in the art. The frequency is then compared to a desired frequency, and an operating voltage is adjusted until the two frequencies match. This (voltage, frequency) control loop is used to dynamically adjust the frequency and/or voltage within certain ranges. Temperature-sensitive ring oscillator 76 ensures that the frequency of the block will not exceed a certain threshold that is temperature-dependent. This limits the maximum frequency of the block to a value that ensures that the block will not exceed its thermal budget. This approach can be applied to arbitrary synchronous blocks in either a fully synchronous of GALS system.

Generally speaking, thermally-sensitive delays can be used to limit the maximum frequency of operation of a synchronous block when its frequency is determined by the actual delay of a reference circuit by modifying the reference circuit to include the thermally-sensitive delay element.

Logic Devices

A 5×5 asynchronous field programmable gated array (FPGA), a specific type of asynchronous logic that uses handshaking, running a function-block-intensive benchmark was simulated to demonstrate a circuit transiently reaching a self-heating equilibrium. The design of the particular FPGA simulated is described in J. Teifel and R. Manohar, "Highly pipelined asynchronous FPGAS", *Proceedings of International Symposium on Field Programmable Gate Arrays*, February 2004, the contents of which are hereby incorporated by reference. The original design was modified by adding thermally-sensitive inverters to the handshake acknowledges coming from the input buffers of each logic block, resulting in a total of four modified inverters per FPGA tile. (In practice, all four modified sites could even share the same thermally-sensitive voltage source 12 from FIG. 1.) Since the original FPGA design operated at such low power, the switching energy was artificially amplified by a factor of 100 in this simulation to emulate self-overheating.

TABLE 2

| | normalized throughput | |
|---|---|---|
| Temperature ° C. | Original | themally-aware |
| 25 | 1.00 | 1.00 |
| 45 | 0.93 | 0.85 |
| 80 | 0.84 | 0.70 |
| 89 | 0.83 | 0.64 |
| 94 | 0.82 | 0.60 |
| 97 | 0.81 | 0.49 |
| 100 | 0.80 | 0.27 |
| 110 | 0.79 | — |

The asynchronous FPGA benchmark is a finely-pipelined feed-forward computation and, thus, its performance is expected to be limited by the slowest handshake in the forward path. Since critical cycle was expected to be in the hottest thermal region, the normalized throughput is reported against the peak surface temperature in Table 2. As the temperature of the original FPGA increases, its frequency drops at a rate similar to that of the normal ring oscillator, but not enough to keep from self-heating to destructive temperatures. The thermally-aware FPGA's average surface temperature stabilizes at around 100° C. after 1 millisecond of simulated time at an operating frequency of 27% of the room-temperature throughput.

This FPGA example demonstrates an application where global performance is determined by the hottest spots on the die surface. The data-driven nature of asynchronous designs makes it extremely easy to thermally regulate the performance of the entire system by modifying very few points with thermally-sensitive circuits.

FIGS. 12A-12C illustrate a circuit example, wherein an AND logic gate 70 (FIGS. 12A-12B) is augmented (FIG. 12C) with a temperature sensitive voltage source generating a temperature sensitive voltage 72 and a foot transistor 74 in accordance with the principles described above, so as to permit automatic continuous thermal regulation of the modified AND logic gate.

Dynamic Resource Scheduling

The final example presented demonstrates how thermally-sensitive circuits can be used in a method according to an embodiment of the invention to dynamically schedule activity away from hot-spots. Chip dies naturally have nonuniform thermal signatures depending on physical design and dynamic operation characteristics. While synchronous circuits may benefit from a more uniform thermal profile, asynchronous circuits have an additional benefit where high performance may be sustained by scheduling work to cooler units. The entire system need not slow down on account of a single hot-spot.

Figure 10:
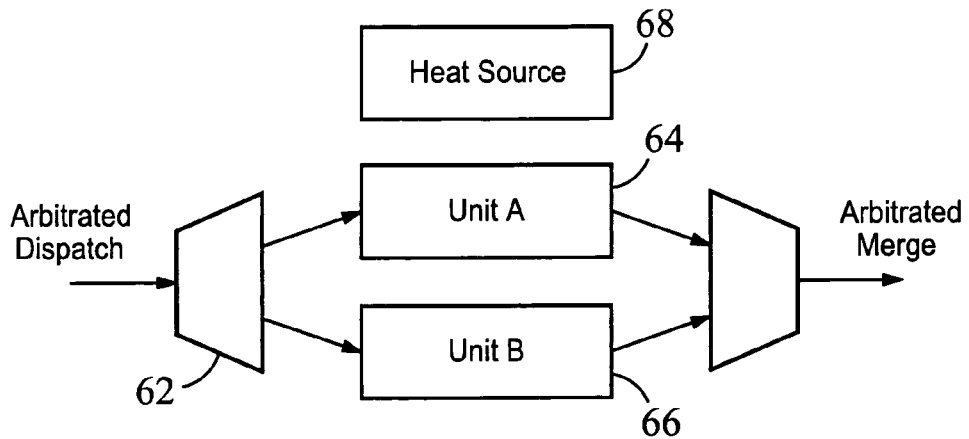
FIG. 10 is a block diagram illustrating a thermally-sensitive dynamic resource scheduler system in accordance with an embodiment of the present invention.

FIG. 10 illustrates an example asynchronous circuit arrangement, where an arbitrated dispatcher 62 can forward data to one of two twin function units 64,66. Function unit 'A' 64 abuts a heat source 68, mimicking the heat signature from power-hungry circuits. Unit 'B' 66 is placed further away from the heat source 68. Each function unit 64,66 is modified with one additional thermally-sensitive inverter (logic gate) generating the input acknowledge that indicates which unit is ready to receive and process data. An arbiter (optional, those of skill in the art will appreciate that dispatcher without arbiters may be utilized) in the dispatcher 62 chooses between these acknowledges (the simulated arbiter is fair; no input will remain ready and unserviced for more than one iteration of the other input.) This represents a simple mechanism by which an asynchronous dispatch unit might schedule instructions in a dynamically scheduled asynchronous microprocessor. The dispatch circuit would, under normal circumstances, simply schedule an equal number of instructions to the two function units, thereby increasing execution throughput.

TABLE 3

| Temp.-A | A cycles | Temp.-B | B cycles |
|---|---|---|---|
| 40 | 46 | 40 | 46 |
| 60 | 43 | 42 | 44 |
| 80 | 35 | 45 | 36 |
| 90 | 31 | 49 | 32 |
| 95 | 28 | 57 | 34 |
| 98 | 24 | 64 | 36 |
| 99 | 19 | 76 | 38 |
| 99.8 | 14 | 83.5 | 29 |
| 100 | 12 | 45 | 49 |
| 101 | 8 | 45 | 48 |
| 102 | 5 | 45 | 49 |
| 103 | 4 | 46 | 48 |
| 104 | 2 | 46 | 48 |

One simulation run used a heat source with negative-thermal-feedback, so the temperature never exceeded 100° C. Table 3 summarizes the correlation between function unit temperatures (Temp. A and B) and the corresponding number of arbitrated iterations (A and B cycles) for a fixed-size window of time. As unit A 64 approaches the threshold temperature, its acknowledges to the arbiter/dispatcher 62 arrive less frequently. In steady-state (at 99.8° C.), the arbitration ratio is approximately 2:1.

A second simulation run used a heat source without thermal-feedback to demonstrate the effect at even higher temperatures, shown in the bottom part of Table 3. Beyond 100° C., unit A 64 practically stops operating, yielding almost all of the computation work to unit B 66. Once unit A 64 cools down, it will begin to request data from the dispatcher 62 more frequently.

It is to be emphasized that the present invention uses no direct temperature-sensing in arbitration, and is thus, very simple and efficient. No explicit temperature monitoring and scheduling logic is needed to be incorporated into the dispatcher, as might be required if conventional temperature sensors were used to control the scheduling. Proper application of a thermally-sensitive circuit can achieve a simple form temperature-aware resource-scheduling with minimal modifications to an existing asynchronous circuit.

F. CONCLUSION

The present invention provides thermally-sensitive circuit that can be used in inventive methods to regulate gate delays in digital circuits. The temperature response of a circuit is first characterized, using one particular set of bias voltages and transistor sizes. Then, a temperature-sensitive voltage source can be constructed that can be used to throttle the speed of selected logic gates. The output of a thermally-sensitive delay element is suitable for digital asynchronous circuits (see Alain 1. Martin. "The limitations to delay-insensitivity in asynchronous circuits", *Proceedings of the 6th Conference on Advanced Research in VLSI*, pages 263-278. Massachusetts Institute of Technology, 1990, incorporated herein by reference.) Several applications of the thermally-sensitive transistors in self-regulating the performance of asynchronous circuits in temperature-critical situations have been described.

Of importance is the simplicity of the technique. With only local and minimal modifications to an existing asynchronous circuit, a design can be made thermally-aware and slow itself down without interruption of operation to prevent self-overheating. An asynchronous circuit may even halt and resume operation correctly at an arbitrarily later time later with no additional control circuitry, which makes performance-regulating thermal circuits trivial to apply. The timing robustness alone mitigates the need for additional control circuitry and redesign effort. A small number of strategically placed thermally-sensitive gates is sufficient to regulate the global operating performance across an entire asynchronous system. By significantly slowing down the operation of circuits in hot-spots, it has been shown that the same circuits may be used to dynamically steer work to cooler units, thereby localizing performance regulation and achieving better temperature uniformity.

Although the invention has been described with respect to various embodiments, it should be realized this invention is also capable of a wide variety of further and other embodiments within the spirit of the invention.

The invention claimed is:

1. An apparatus that regulates gate delays of an asynchronous digital circuit, comprising:
   a temperature sensitive voltage source outputting a voltage signal indicative of the temperature of the asynchronous circuit, wherein said voltage signal reflects non-linear temperature sensitivity above a predetermined threshold temperature; and
   a delay mechanism receiving said temperature sensitive voltage signal as input, said delay mechanism adapted to vary a delay with temperature and configured to automatically continuously modulate a speed of signal propagation through the circuit in response to said voltage signal, said temperature sensitive voltage source and said delay mechanism incorporated in the circuit in a feedback configuration; said feedback configuration resulting in modulation of frequency/speed of signal propagation of the circuit.

2. An apparatus that regulates gate delays of an asynchronous digital circuit, comprising:
   a temperature sensitive voltage source outputting a voltage signal indicative of the temperature of the asynchronous circuit, wherein said voltage signal reflects non-linear temperature sensitivity above a predetermined threshold temperature; and
   a delay mechanism receiving said temperature sensitive voltage signal as input, said delay mechanism configured to automatically continuously modulate the speed of signal propagation through the circuit in response to said voltage signal, thereby causing circuit elements within the asynchronous circuit to switch less frequently and consequently causing the circuit elements to generate less heat with increasing circuit temperature;

wherein said temperature sensitive voltage source comprises:
 a first transistor having a source electrode coupled to an output node, a gate electrode coupled to a first bias voltage biasing said first transistor in a sub-threshold region so as to have a first thermal sensitivity, and a drain electrode; and
 a second transistor having a drain electrode coupled to the output node and the source electrode of the first transistor, a gate electrode coupled to a second bias voltage biasing said second transistor in a sub-threshold region so as to have a second thermal sensitivity distinct from the first thermal sensitivity, and a source electrode;
 wherein the first transistor and the second transistor form a resistive voltage divider, such that the temperature sensitive voltage is produced at the output node.

3. The apparatus of claim 2, wherein:
 said first transistor is biased in a near-threshold region; and
 said second transistor is biased in deep sub-threshold region.

4. The apparatus of claim 2, wherein said first bias voltage and said second bias voltages are provided by voltage sources disposed off-chip relative to said first transistor and said second transistor.

5. The apparatus of claim 2, further comprising a conditional staticizer coupled to the output node of said temperature sensitive voltage source, said conditional staticizer adapted to maintain a voltage level of a logic gate of the asynchronous circuit existing when the temperature of the circuit exceeds a predetermined threshold temperature and until the circuit temperature falls below said threshold temperature.

6. The apparatus of claim 2, wherein the source-drain current of said foot transistor and speed of signal propagation through the circuit vary non-linearly above a predetermined threshold voltage, until a floor current in the foot transistor is reached.

7. The apparatus of claim 2, wherein peak current flowing through said first transistor and second transistors during operation is on the order of pico-amperes to tens of nano-amperes.

8. An apparatus that regulates gate delays of an asynchronous digital circuit, comprising:
 a temperature sensitive voltage source outputting a voltage signal indicative of the temperature of the asynchronous circuit, wherein said voltage signal reflects non-liner temperature sensitivity above a predetermined threshold temperature; and
 a delay mechanism receiving said temperature sensitive voltage signal as input, said delay mechanism configured to automatically continuously modulate the speed of signal propagation through the circuit in response to said voltage signal;
 said temperature sensitive voltage source and said delay mechanism incorporated in the circuit in a feedback configuration; said feedback configuration resulting in modulation of frequency/speed of signal propagation of the circuit;
 wherein said delay mechanism comprises a foot transistor of a pull-down circuit, said foot transistor including a gate electrode connected to the output node of the temperature sensitive voltage source, a drain electrode connected to a logic gate, and a source electrode coupled to ground, such that changes in the temperature sensitive voltage source voltage modulates source-drain current of the foot transistor and thereby the speed of a pull-down transition.

9. A thermally-aware integrated circuit device, comprising:
 an asynchronous circuit including at least one logic gate disposed in a critical path of said asynchronous circuit;
 at least one temperature sensitive voltage source associated with said at least one logic gate, said at least one temperature sensitive voltage source outputting a voltage signal indicative of the temperature of the asynchronous circuit, wherein said voltage signal reflects non-linear temperature sensitivity above a predetermined threshold temperature; and
 at least one delay mechanism associated with said at least one logic gate, each at least one delay mechanism receiving a temperature sensitive voltage signal as input, said at least one delay mechanism configured to automatically continuously modulate the speed of signal propagation through the asynchronous circuit in response to said voltage signal, said at least one temperature sensitive voltage source and said at least one delay mechanism incorporated in the circuit in a feedback configuration; said feedback configuration resulting in modulation of frequency/speed of signal propagation of the circuit.

10. The thermally-aware integrated circuit device of claim 9, wherein said delay mechanism comprises a foot transistor of a pull-down circuit, said foot transistor including a gate electrode connected to the output node of the temperature sensitive voltage source, a drain electrode connected to a logic gate, and a source electrode coupled to ground, such that changes in the temperature sensitive voltage source voltage modulates source-drain current of the foot transistor and thereby the speed of a pull-down transition.

11. A thermally-aware integrated circuit device, comprising:
 an asynchronous circuit including at least one logic gate disposed in a critical path of said asynchronous circuit;
 at least one temperature sensitive voltage source associated with said at least one logic gate, said at least one temperature sensitive voltage source outputting a voltage signal indicative of the temperature of the asynchronous circuit, wherein said voltage signal reflects non-linear temperature sensitivity above a predetermined threshold temperature; and
 at least one delay mechanism associated with said at least one logic gate, each at least one delay mechanism receiving a temperature sensitive voltage signal as input, said at least one delay mechanism configured to automatically continuously modulate the speed of signal propagation through the asynchronous circuit in response to said voltage signal, thereby causing circuit elements within the asynchronous circuit to switch less frequently and consequently causing the circuit elements to generate less heat with increasing circuit temperature, wherein each of said at least one temperature sensitive voltage sources comprises:
 a first transistor having a source electrode coupled to an output node, a gate electrode coupled to a first bias voltage biasing said first transistor in a sub-threshold region so as to have a first thermal sensitivity, and a drain electrode; and
 a second transistor having a drain electrode coupled to the output node and the source electrode of the first transistor, a gate electrode coupled to a second bias voltage biasing said second transistor in a sub- Threshold region so as to have a second thermal sensitivity distinct from the first thermal sensitivity, and a source electrode;

wherein the first transistor and the second transistor form a resistive voltage divider, such that the temperature sensitive voltage is produced at the output node.

12. A thermally-aware integrated circuit device, comprising:

an asynchronous circuit including at least one logic gate disposed in a critical path of said asynchronous circuit;

at least one temperature sensitive voltage source associated with said at least one logic gate, said at least one temperature sensitive voltage source outputting a voltage signal indicative of the temperature of the asynchronous circuit, wherein said voltage signal reflects non-liner temperature sensitivity above a predetermined threshold temperature; and at least one delay mechanism associated with said at least one logic gate, each at least one delay mechanism receiving a temperature sensitive voltage signal as input, said at least one delay mechanism configured to automatically continuously modulate the speed of signal propagation through the asynchronous circuit in response to said voltage signal, thereby causing circuit elements within the asynchronous circuit to switch less frequently and consequently causing the circuit elements to generate less heat with increasing circuit temperature; wherein:

said at least one gate comprises a transistor inverter stage in a multi-stage ring oscillator; and said multi-stage ring oscillator operates with a frequency that varies with the temperature of the asynchronous circuit and quickly degrades above the threshold temperature.

13. A thermally-aware integrated circuit device. comprising:

an asynchronous circuit including at least one logic sate disposed in a critical path of said asynchronous circuit;

at least one temperature sensitive voltage source associated with said at least one logic gate, said at least one temperature sensitive voltage source outputting a voltage signal indicative of the temperature of the asynchronous circuit, wherein said voltage signal reflects non-linear temperature sensitivity above a predetermined threshold temperature; and at least one delay mechanism associated with said at least one logic gate, each at least one delay mechanism receiving a temperature sensitive voltage signal as input, said at least one delay mechanism configured to automatically continuously modulate the speed of signal propagation through the asynchronous circuit in response to said voltage signal; thereby causing circuit elements within the asynchronous circuit to switch less frequently and consequently causing the circuit elements to generate less heat with increasing circuit temperature; wherein:

said at least one logic gate comprises at least one logic gate integrated with a corresponding handshake acknowledge input buffer of a logic block; and said logic block operates with a normalized throughput that automatically varies with temperature.

14. A thermally-aware integrated circuit device, comprising:

an asynchronous circuit including at least one logic gate disposed in a critical path of said asynchronous circuit;

at least one temperature sensitive voltage source associated with said at least one logic gate, said at least one temperature sensitive voltage source outputting a voltage signal indicative of the temperature of the asynchronous circuit, wherein said voltage signal reflects non-liner temperature sensitivity above a predetermined threshold temperature;

at least one delay mechanism associated with said at least one logic gate, each at least one delay mechanism receiving a temperature sensitive voltage signal as input, said at least one delay mechanism configured to automatically continuously modulate the speed of signal propagation through the asynchronous circuit in response to said voltage signal, thereby causing circuit elements within the asynchronous circuit to switch less frequently and consequently causing the circuit elements to generate less heat with increasing circuit temperature; and an asynchronous dispatcher adapted to forward data among multiple similar function units and to select the multiple similar function units to which data should be sent based upon the readiness of a function unit to accept data;

wherein the at least one logic gate comprises a plurality of logic gates, each logic gate associated with one of the multiple similar funtion units and coupled to a corresponding buffer of a logic block of each function unit adapted to generate an input acknowledge for the dispatcher indicating the readiness of the associated function unit to receive and process data, such that the frequency of readiness acknowledges sent from a particular function unit to the dispatcher varies with temperature.

15. A thermally-aware integrated circuit device, comprising:

an asynchronous circuit including at least one logic gate disposed in a critical path of said asynchronous circuit;

at least one temperature sensitive voltage source associated with said at least one logic gate, said at least one temperature sensitive voltage source outputting a voltage signal indicative of the temperature of the asynchronous circuit, wherein said voltage signal reflects non-linear temperature sensitivity above a predetermined threshold temperature; and at least one delay mechanism associated with said at least one logic gate, each at least one delay mechanism receiving a temperature sensitive voltage signal as input, said at least one delay mechanism configured to automatically continuously modulate the speed of signal propagation through the asynchronous circuit in response to said voltage signal thereby causing circuit elements within the asynchronous circuit to switch less frequently and consequently causing the circuit elements to generate less heat with increasing circuit temperature; wherein:

said at least one logic gate comprises a logic gate in a frequency synthesizer for a synchronous block; and said frequency synthesizer limits an operating frequency of the synchronous block to a maximum frequency that ensures that the synchronous blocking does not exceed its thermal budget.

16. A method of automatically regulating the performance and power consumption of an asynchronous circuit, comprising the steps of:

indirectly generating a voltage signal indicative of the temperature of the asynchronous circuit, said voltage signal reflecting non-linear temperature sensitivity above a predetermined threshold temperature;

automatically continuously modulating the speed of signal propagation through the circuit in response to said voltage signal, said continuous modulation comprising a varying delay; and incorporating said voltage signal and said varying delay in the asynchronous circuit in a feedback configuration; said feedback configuration resulting in modulation of frequency/speed of signal propagation of the asynchronous circuit.

17. The method of claim 16 wherein indirect temperature-sensing is utilized in generating the voltage signal.

18. A method of automatically regulating the performance and power consumption of an asynchronous circuit, comprising the steps of:

indirectly generating a voltage signal indicative of the temperature of the asynchronous circuit, said voltage signal reflecting non-linear temperature sensitivity above a predetermined threshold temperature; and automatically continuously modulating the speed of signal propagation through the circuit in response to said voltage signal, thereby causing circuit elements within the asynchronous circuit to switch less frequently and consequently causing the circuit elements to generate less heat with increasing circuit temperature;

wherein indirectly generating the voltage signal comprises:

biasing a gate electrode of first transistor having a drain electrode and a source electrode coupled to an output node in a sub-threshold region so as to have a first thermal sensitivity; and biasing a gate electrode of a second transistor having a drain electrode coupled to the output node and the source electrode of the first transistor and a source electrode, in a sub-threshold region so as to have a second thermal sensitivity distinct from the first thermal sensitivity;

wherein the first transistor and the second transistor form a resistive voltage divider, wherein indirectly generating the voltage signal comprises:

biasing a gate electrode of first transistor having a drain electrode and a source electrode coupled to an output node in a sub-threshold region so as to have a first thermal sensitivity; and biasing a gate electrode of a second transistor having a drain electrode coupled to the output node and the source electrode of the first transistor and a source electrode, in a sub-threshold region so as to have a second thermal sensitivity distinct from the first thermal sensitivity;

wherein the first transistor and the second transistor form a resistive voltage divider, such that the temperature sensitive voltage is produced at the output node.

19. A method of automatically regulating the performance and power consumption of an asynchronous circuit, comprising the steps of:

indirectly generating a voltage signal indicative of the temperature of the asynchronous circuit, said voltage signal reflecting non-liner temperature sensitivity above a predetermined threshold temperature; and automatically continuously modulating the speed of signal propagation through the circuit in response to said voltage signal, thereby causing circuit elements within the asynchronous circuit to switch less frequently and consequently causing the circuit elements to generate less heat with increasing circuit temperature;

wherein indirectly generating the voltage signal comprises:

biasing a gate electrode of first transistor having a drain electrode and a source electrode coupled to an output node in a sub-threshold region so as to have a first thermal sensitivity; and biasing a gate electrode of a second transistor having a drain electrode coupled to the output node and the source electrode of the first transistor and a source electrode, in a sub-threshold region so as to have a second thermal sensitivity distinct from the first thermal sensitivity;

wherein the first transistor and the second transistor form a resistive voltage divider, such that the temperature sensitive voltage is produced at the output node; and wherein:

said first transistor is biased in a near-threshold region; and said second transistor is biased in deep sub-threshold region.

20. A method of automatically regulating the performance and power consumption of an asynchronous circuit, comprising the steps of:

indirectly generating a voltage signal indicative of the temperature of the asynchronous circuit, said voltage signal reflecting non-linear temperature sensitivity above a predetermined threshold temperature; and automatically continuously modulating the speed of signal propagation through the circuit in response to said voltage signal; said modulating the speed of signal propagation comprising introducing a delay dependent upon said voltage signal into a logic gate of the asynchronous circuit; and incorporating said voltage signal and said delay in the asynchronous circuit in a feedback configuration.

21. In an integrated circuit device including an asynchronous dispatcher adapted to forward data among multiple similar function units and to select the multiple similar function units to which data should be sent, a method of thermally-aware dynamic resource scheduling, comprising:

providing at least one logic gate, each logic gate associated with one of said function units and coupled to a corresponding logic block buffer of each function unit adapted to generate an input acknowledge for the dispatcher indicating the readiness of the associated function unit to receive and process data;

generating at least one voltage signal indicative of the temperature of a corresponding function unit, said at least one voltage signal reflecting non-linear temperature sensitivity above a predetermined threshold temperature;

automatically continuously modulating the speed of signal propagation through the at least one logic gate in response to said voltage signals thereby causing said logic gates to switch less frequently and consequently causing the frequency of readiness acknowledges transmitted from a particular function unit to the dispatcher to vary with temperature of the particular function unit;

selecting a readiness acknowledge from the readiness acknowledges transmitted from the function units; and sending data to the function unit associated with the selected acknowledge.

22. The method of claim 21, wherein indirect temperature-sensing is utilized in generating the at least one voltage.

23. The method of claim 21, wherein indirectly generating the voltage signal comprises:

biasing a gate electrode of first transistor having a drain electrode and a source electrode coupled to an output node in a sub-threshold region so as to have a first thermal sensitivity; and biasing a gate electrode of a second transistor having a drain electrode coupled to the output node and the source electrode of the first transistor and a source electrode, in a sub-threshold region so as to have a second thermal sensitivity distinct from the first thermal sensitivity;

wherein the first transistor and the second transistor form a resistive voltage divider, such that the temperature sensitive voltage is produced at the output node.

24. The method of claim 23, wherein:
said first transistor is biased in a near-threshold region; and
said second transistor is biased in deep sub-threshold region.

25. The method of claim 21, wherein modulating the speed of signal propagation comprises introducing a delay dependent upon the temperature sensitive voltage into a logic gate of the asynchronous circuit.

* * * * *

UNITED STATES PATENT AND TRADEMARK OFFICE
CERTIFICATE OF CORRECTION

PATENT NO.         : 7,411,436 B2                                         Page 1 of 1
APPLICATION NO. : 11/365567
DATED              : August 12, 2008
INVENTOR(S)        : David Fang et al.

It is certified that error appears in the above-identified patent and that said Letters Patent is hereby corrected as shown below:

Claim 8 (Col. 13, Line 50) should read -- non-linear -- and not "non-liner"
Claim 11 (Col. 15, Line 1) should read -- threshold -- and not "Threshold"
Claim 12 (Col. 15, Line 15) should read -- non-linear -- and not "non-liner"
Claim 13 (Col. 15, Line 35) should read -- device, comprising -- and not "device. comprising"
Claim 13 (Col. 15, Line 37) should read -- gate -- and not "sate"
Claim 14 (Col. 16, Line 3) should read -- non-linear -- and not "non-liner"
Claim 14 (Col. 16, Line 24) should read -- function -- and not "funtion"

Signed and Sealed this

Twenty-first Day of October, 2008

JON W. DUDAS
*Director of the United States Patent and Trademark Office*